US008526635B2

(12) United States Patent
Larsen et al.

(10) Patent No.: US 8,526,635 B2
(45) Date of Patent: Sep. 3, 2013

(54) GROUNDING SWITCH METHOD AND APPARATUS

(75) Inventors: Christian Larsen, Irvine, CA (US); Lorenzo Crespi, Costa Mesa, CA (US)

(73) Assignee: Conexant Systems, Inc., Irvine, CA (US)

( * ) Notice: Subject to any disclaimer, the term of this patent is extended or adjusted under 35 U.S.C. 154(b) by 488 days.

(21) Appl. No.: 12/828,716

(22) Filed: Jul. 1, 2010

(65) Prior Publication Data

US 2012/0002821 A1 Jan. 5, 2012

(51) Int. Cl.
*H04B 15/00* (2006.01)
(52) U.S. Cl.
USPC .......................................... 381/94.5; 381/94.1
(58) Field of Classification Search
USPC ................. 381/94.5, 94.1, 120, 121, 28, 306, 381/72, 74; 330/51, 149, 901, 182, 281, 330/315; 327/540, 541; 257/107, 118, 113, 257/182, 918
See application file for complete search history.

(56) References Cited

U.S. PATENT DOCUMENTS

| 6,011,424 | A * | 1/2000 | Sneep | 327/482 |
| 7,760,016 | B2 * | 7/2010 | Kanji et al. | 330/51 |
| 7,940,940 | B2 * | 5/2011 | Kakumoto et al. | 381/94.5 |
| 8,036,399 | B2 * | 10/2011 | Chao et al. | 381/94.1 |
| 8,199,930 | B2 * | 6/2012 | Wu | 381/94.5 |
| 2006/0023897 | A1 * | 2/2006 | Ginsberg et al. | 381/94.8 |
| 2007/0009110 | A1 | 1/2007 | Kakumoto et al. | |
| 2008/0137882 | A1 * | 6/2008 | Tsai et al. | 381/94.5 |

FOREIGN PATENT DOCUMENTS

| EP | 0091119 A2 | 12/1983 |
| JP | 07240632 | 9/1995 |
| JP | 2001244749 | 9/2001 |
| JP | 2006238285 | 9/2006 |

OTHER PUBLICATIONS

The International Bureau of WIPO; International Preliminary Report on Patentability; PCT Application No. PCT/US2011/041239; Jan. 17, 2013.
European Patent Office; International Search Report and Written Opinion; PCT Application No. PCT/US2011/041239; Dec. 23, 2011.

* cited by examiner

*Primary Examiner* — Mohammad Islam
*Assistant Examiner* — David Ton
(74) *Attorney, Agent, or Firm* — Jackson Walker L.L.P.; Christopher J. Rourk

(57) ABSTRACT

A grounding switch is described which operates properly even in the presence of negative voltages on a signal line. The grounding switch uses isolated field effect transistors that have their substrates tied to different voltages. The isolated field effect transistor has a gate voltage and substrate voltage which can be pulled down to a negative voltage when the signal line has a negative voltage allowing the switch to remain open even with a negative voltage.

15 Claims, 7 Drawing Sheets

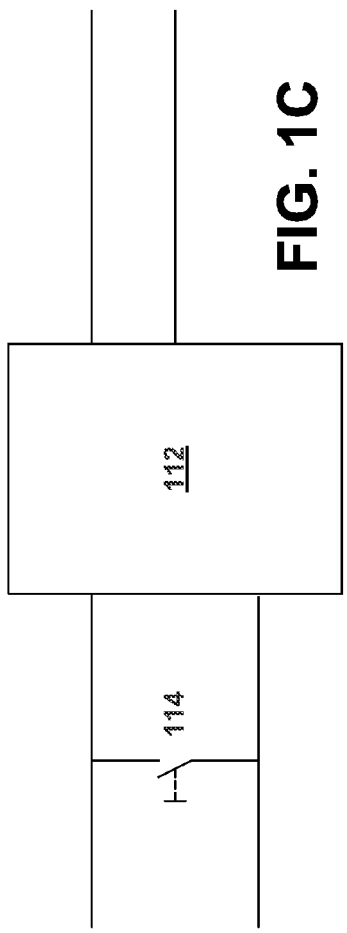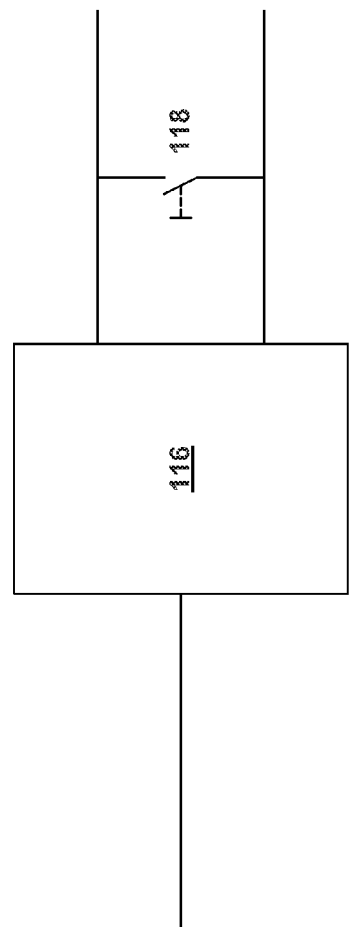

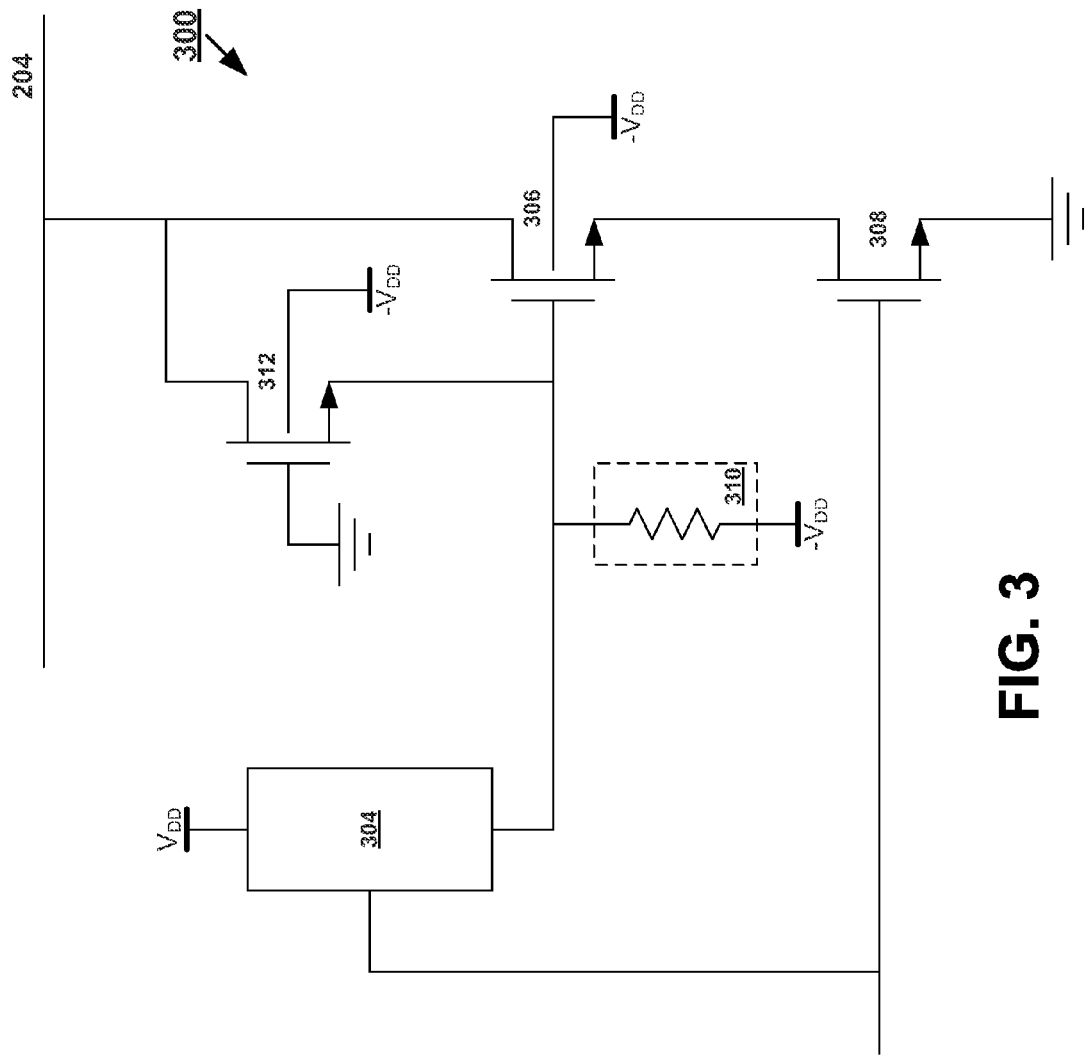
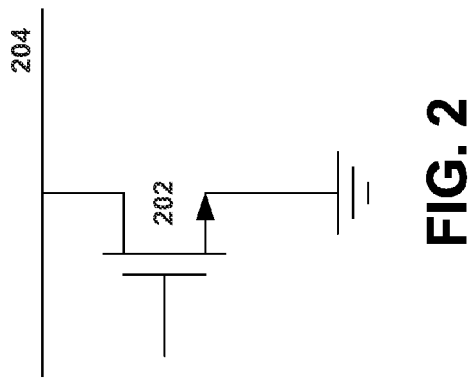

GROUNDING SWITCH METHOD AND APPARATUS

TECHNICAL FIELD

This invention relates generally to the electronic switches and specifically to grounding switches that operate in the presence of negative voltage signals.

BACKGROUND ART

Typically, grounding switches, often comprising a single field effect transistor (FET), are used to ground an input or an output to a zero or ground voltage. In audio applications this can be used to prevent audio artifacts such as audible pops. For example, to prevent an undesirable audible pop a grounding switch can be used to ground an input to an audio circuit during an initialization phase before the audio circuit is equipped to handle an input signal. The switch can release the input from ground once the audio circuit has been initialized. Another application is where a grounding switch is used to ground an output during the startup of an audio circuit, when the audio circuit may produce glitches in the output leading to an audible pop.

SUMMARY OF INVENTION

A grounding switch is described which operates properly in the presence of negative voltages on a signal line. In one embodiment, the switch comprises an n-channel field effect transistor (NFET) with an isolated substrate which allows the substrate near the NFET to have a different potential than the substrate around the other circuitry in the grounding switch. A pull down element is used to turn this NFET off.

In one embodiment, the switch comprises a pull up circuit and the substrate of the NFET is coupled to a negative supply voltage. When the control signal is low, the pull up circuit is inactive and the pull down element pulls the gate of the NFET down to the negative supply voltage causing the NFET to turn off even in the presence of a signal with a negative voltage on its source or drain. A second NFET, which does not have to have an isolated substrate, can be added in series with the first NFET to prevent damage to the first NFET due to large voltage swings. In one variant, the pull down element comprises a single resistor.

In another embodiment where a negative supply voltage is not available, the substrate of the isolated NFET is tied to the signal line. The switch comprises a second NFET, which need not have a separate substrate connection, in series with the isolated NFET. When the control input is high, both NFETs turn on, turning the switch on. When the control input is low, the isolated NFET switches off when the signal has a negative voltage and the second NFET switches off when the signal has a positive voltage, thus switching the grounding switch off regardless of the signal voltage.

In one embodiment the pull down element comprises a circuit having another isolated NFET where the drain and substrate are connected to the signal. In another embodiment, the pull-up circuit comprises a p-channel field effect transistor (PFET), optionally a second PFET, and an inverter.

In another embodiment, the grounding switch is a circuit comprising two transistors in series operable to turn on when the control input is high. In operation, the first transistor is turned off when the control input is low and the signal voltage is positive, and the second transistor is turned off when the control input is low and the signal voltage is negative. The second transistor can be turned on by pulling the gate of the transistor to the positive supply voltage and can be turned off by pulling the gate down to the negative supply voltage while maintaining its substrate at the negative supply voltage. Alternately, the second transistor can be turned off when the signal voltage is negative by pulling the gate down to the signal voltage while maintaining its substrate at the signal voltage.

In one embodiment, the grounding switch is used in an audio driver to suppress audible pops. The audio driver can be used to suppress an undesired audio artifact in many electronic devices including but not limited to personal computer sound cards, voice-over-IP telephones, cellular telephones, digital picture frames, universal serial bus headsets, televisions, video game consoles, MP3 players and Bluetooth headsets.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1C and 1D shows differential analogs of the systems described in FIGS. 1A and 1B;

FIG. 2 shows an embodiment of a grounding switch comprising a single NFET;

FIG. 3 shows an embodiment of a grounding switch which can tolerate negative voltages seen at the signal line;

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Figure 1A:
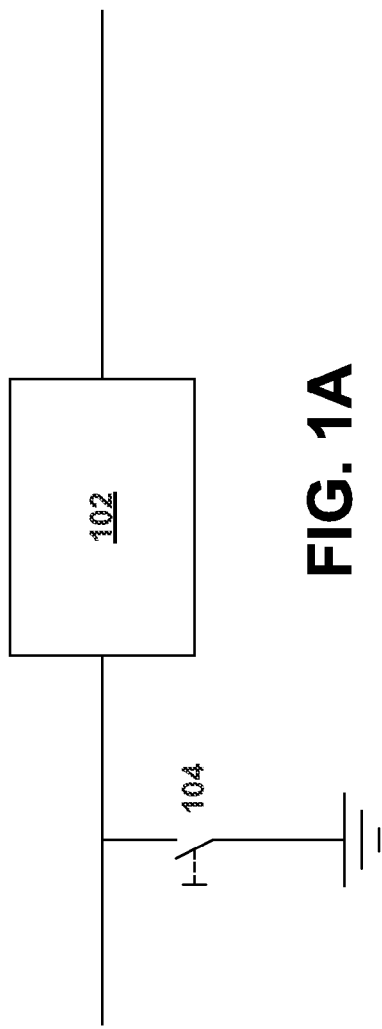
FIG. 1A shows an embodiment of a system employing a grounding switch to tie a single ended input to ground.

FIG. 1A shows an embodiment of a system employing a grounding switch to tie a single ended input to ground. System 102 can be any system which receives a single ended input signal. Grounding switch 104 ties the input to ground when closed. An example of such a system is an audio driver which employs grounding switch 104 to zero the signal during power up and power down to prevent the occurrence of a pop sound.

Figure 1B:
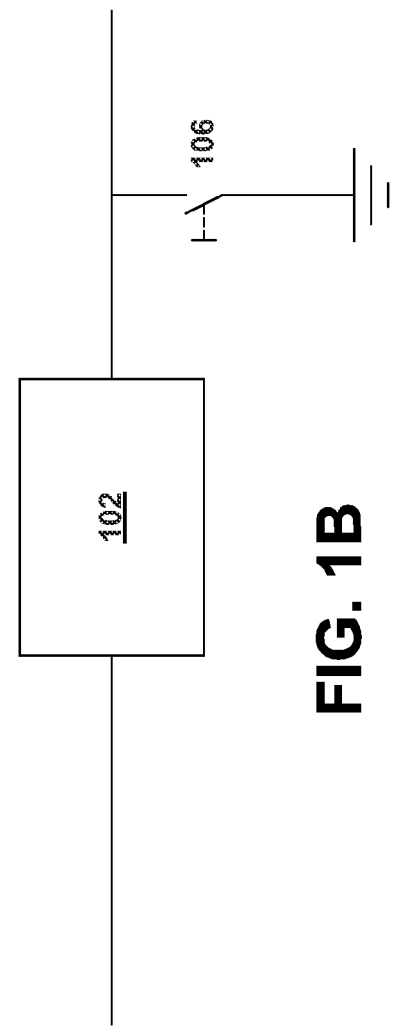
FIG. 1B shows an embodiment of a system employing a grounding switch to tie a single ended output to ground.

FIG. 1B shows an embodiment of a system employing a grounding switch to tie a single ended output to ground. System 102 can be any system which produces a single ended output signal. Grounding switch 106 ties the output to ground when closed. As an example, an audio driver can employ grounding switch 106 to zero the output signal during power up and power down to prevent the occurrence of a pop sound.

FIGS. 1C and 1D shows differential analogs of the systems described in FIGS. 1A and 1B. In particular, FIG. 1C shows an embodiment of system 112 employing switch 114 to tie the two differential inputs together. Though the switch does not specifically tie a signal to ground, for the purposes of this disclosure, a grounding switch can also be used to zero a differential signal by tying the differential signal lines together. System 112 has a differential input which is zeroed by switch 114 when switch 114 is closed. Similarly, FIG. 1D shows an embodiment of system 116 employing switch 118 to tie the two differential outputs together. System 116 has a differential output which is zeroed by switch 118 when switch 118 is closed.

FIG. 2 shows an embodiment of a grounding switch comprising a single NFET. The gate of NFET 202 is connected to a control input, the drain of NFET 202 is connected to signal line 204 and the source is connected to a ground potential. If the switch is used to zero a differential input, signal line 204 is one of the signal lines (e.g., the positive signal line) and the drain is connected to the other signal line (e.g., the negative signal line). When the control input is tied to the positive supply voltage the switch turns on. When the control input is tied to ground, NFET 202 acts as a reverse bias diode and the switch turns off. However, if signal line 204 permits a negative voltage, and NFET 202 is a standard NFET that has a grounded substrate, NFET 202 acts as a forward bias diode when the gate is grounded causing the switch to conduct even though it is supposed to be off. For this reason use of a single NFET is undesirable in many applications, such as audio applications where the voltage can swing in both a positive and negative direction.

FIG. 3 shows an embodiment of a grounding switch which can tolerate negative voltages seen at signal line 204. Grounding switch 300 comprises controllable pull up circuit 304, isolated NFET 306, optional NFET 308, pull down element 310, and isolated NFET 312 Controllable pull-up circuit 304 is responsive to a control signal and pulls the voltage of the gate of isolated NFET 306 to the positive supply voltage (shown as $V_{DD}$) when the control signal is high and provides high impedance when the control signal is low. Isolated NFET 306 is electrically isolated from the substrate and more specifically, its p-well is isolated. This allows the p-well surrounding the NFET 306 to be tied to a different "substrate voltage" from the rest of the circuitry. In this case, NFET 306 has an "isolated substrate connection" tied to a negative supply voltage (for example $-V_{DD}$ shown in the figure), represented by a fourth connection to the usually three connection NFET symbol. Many techniques exist to fabricate isolated FETs including deep n-well fabrication. Finally pull down element 310 which can be a resistor is tied to the negative supply voltage.

When the control input to grounding switch 300 is tied to the supply voltage, NFET 308 is turned on. In addition, pull up circuit 304 pulls up the gate voltage of NFET 306 so it turns on as well, thus turning switch 300 on. This pulls the voltage on signal line 204 to ground.

When the control input to grounding switch 300 is tied to ground, pull-up circuit 304 is deactivated and pull-down element 310 can pull the voltage down to the negative supply voltage which causes NFET 306 to turn off, even in the presence of a negative voltage on signal line 204. However, if the voltage on signal line 204 is positive such as $V_{DD}$ the gate to drain voltage of NFET 306 as a result of the pull down element would be 2 $V_{DD}$, which can exceed the tolerance of NFET 306. Therefore, NFET 312 is included to protect NFET 306. Because the gate of NFET 306 does not need to pull down to $-V_{DD}$, NFET 312 is used to counteract pull down element 310. In fact, when the voltage on signal line 204 is positive, NFET 312 permits a current to flow which allows the voltage on the gate to NFET 306 to rise so that the gate to drain voltage can be within the tolerance of the technology. Because of the potential for a negative source voltage on NFET 312, NFET 312 has a substrate voltage coupled to the negative supply line. NFET 312 Optional NFET 308 can be included to protect NFET 306 from excessive voltages that can occur especially if the signal line swings between the extreme positive and negative voltages, when complementary metal-oxide-semiconductor (CMOS) technology is used. In other technologies or even other CMOS technologies with different design rules, NFET 308 can be omitted. In the present embodiment, the switch operates only so long as the voltage on signal line 204 remains greater than the negative supply voltage.

Figure 4:
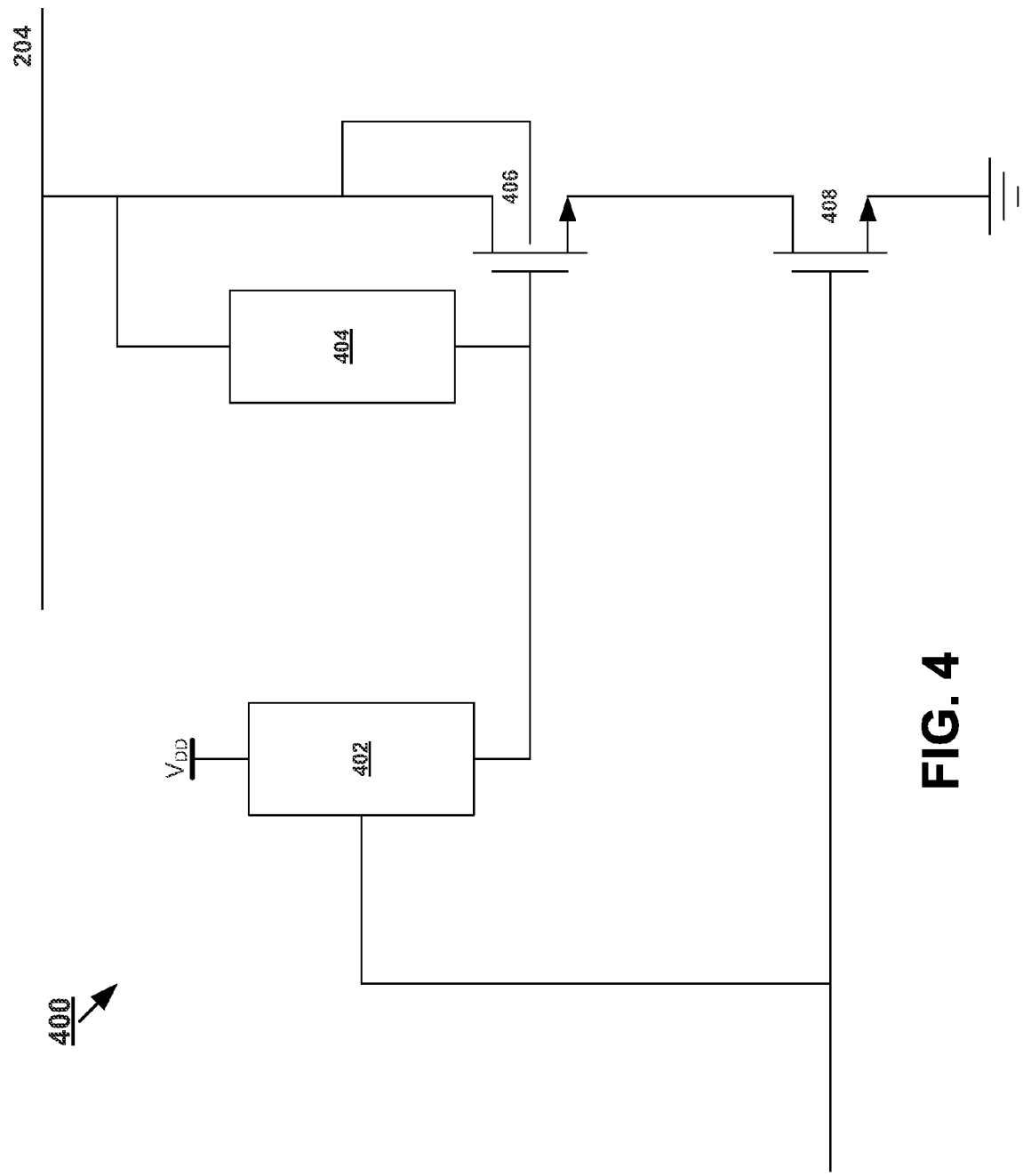
FIG. 4 shows an embodiment of a grounding switch which can tolerate negative voltages on a signal line without a negative reference voltage.

FIG. 4 shows an embodiment of a grounding switch which can tolerate negative voltages on a signal line without the need for a negative supply voltage. Grounding switch 400 comprises controllable pull-up circuit 402, pull-down element 404, isolated NFET 406 and NFET 408. Controllable pull-up circuit 402 functions in a manner similar to that describe for circuit 302 above. NFET 406 is isolated in the same manner as that described for NFET 306 above however the substrate voltage is tied to the drain voltage.

When a positive supply voltage is applied to the control signal, NFET 404 turns on. In addition, pull-up circuit 402 pulls up the gate voltage on NFET 406 causing NFET 406 to turn on, thus turning the switch on. When the control signal is grounded and the voltage on signal line 204 is positive, NFET 408 is turned off. Since NFET 408 is in series with NFET 406, the switch is turned off. When the control signal is grounded and the voltage on signal line 204 is negative, pull-up circuit 402 is left in a high impedance state, allowing pull-down element 404 to pull down the gate voltage of NFET 406 down to the voltage of signal line 204 which is also the drain voltage of NFET 406, causing NFET 406 to turn off. Since NFET 408 and NFET 406 are in series, the switch is turned off.

Figure 5:
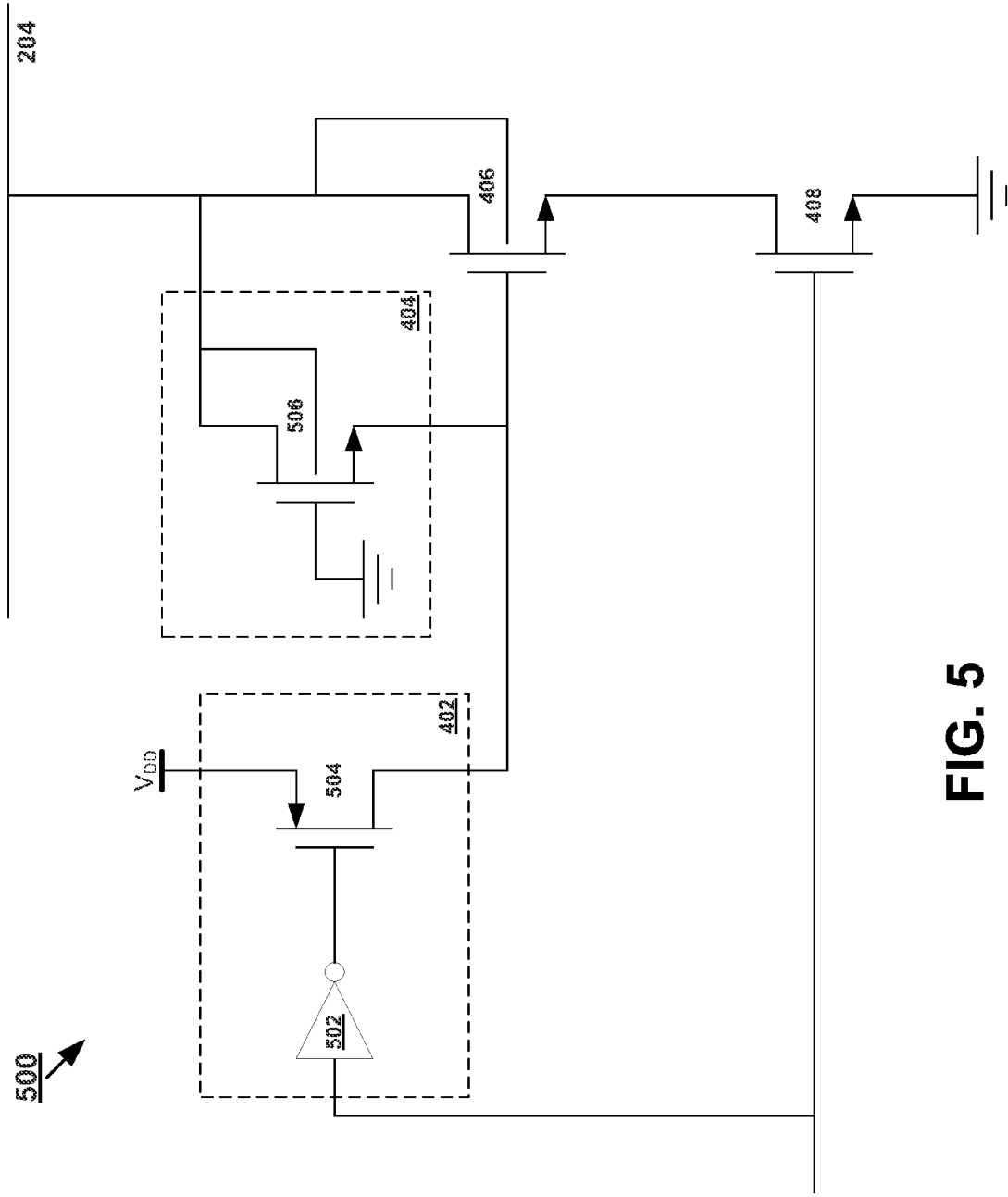
FIG. 5 shows an embodiment of a grounding switch.

FIG. 5 shows an embodiment of grounding switch 500. Pull up circuit 402 includes an inverter 502 and PFET 504, and pull-down element 404 includes isolated NFET 506. When a control signal is high, inverter 502 grounds the gate of PFET 504 which turns on PFET 504, causing a positive gate voltage at NFET 406 which turns NFET 406 on. Because both NFET 406 and NFET 408 are turned on, the switch is turned on. When the control signal is grounded, inverter 502 imposes a positive supply voltage on the gate of PFET 504 turning the PFET off effectively disconnecting the pull-up circuit 402 from NFET 406. With the pull-up circuit disconnected, NFET 506 can manipulate the voltage on the gate of NFET 406. When the voltage on signal line 204 is positive, the drain and substrate of NFET 506 is positive, NFET 506 acts as a forward biased diode between the source and the substrate connections. As a result, NFET 506 pulls up the gate of NFET 406. Likewise, because the drain and substrate of NFET 406 is also positive, NFET 406 acts as a forward biased diode and pulls up on the drain of NFET 408. However, because the control line is low, NFET 408 is turned off, so the switch is turned off. When the voltage on signal line 204 is negative, the role of the source and drain are essentially reversed. The drain to gate voltage is negative, but can be viewed as a positive gate-to-source voltage of NFET 506 where the source and drain are reversed. This causes NFET 506 to turn on which pulls down (because the signal line is negative it is a pull down rather than a pull up) the gate voltage of NFET 406 to the signal line 204 voltage. Because the drain (which now functions as a source) voltage and the gate voltage are made equal by NFET 506, NFET 406 turns off, turning the switch off. One advantage in this embodiment of NFET 506 as the pull-up element over a resistor described in FIG. 3 is that NFET 506 only draws current in the specific case where the voltage on signal line 204 is negative, whereas a resistor would draw current all the time.

Figure 6:
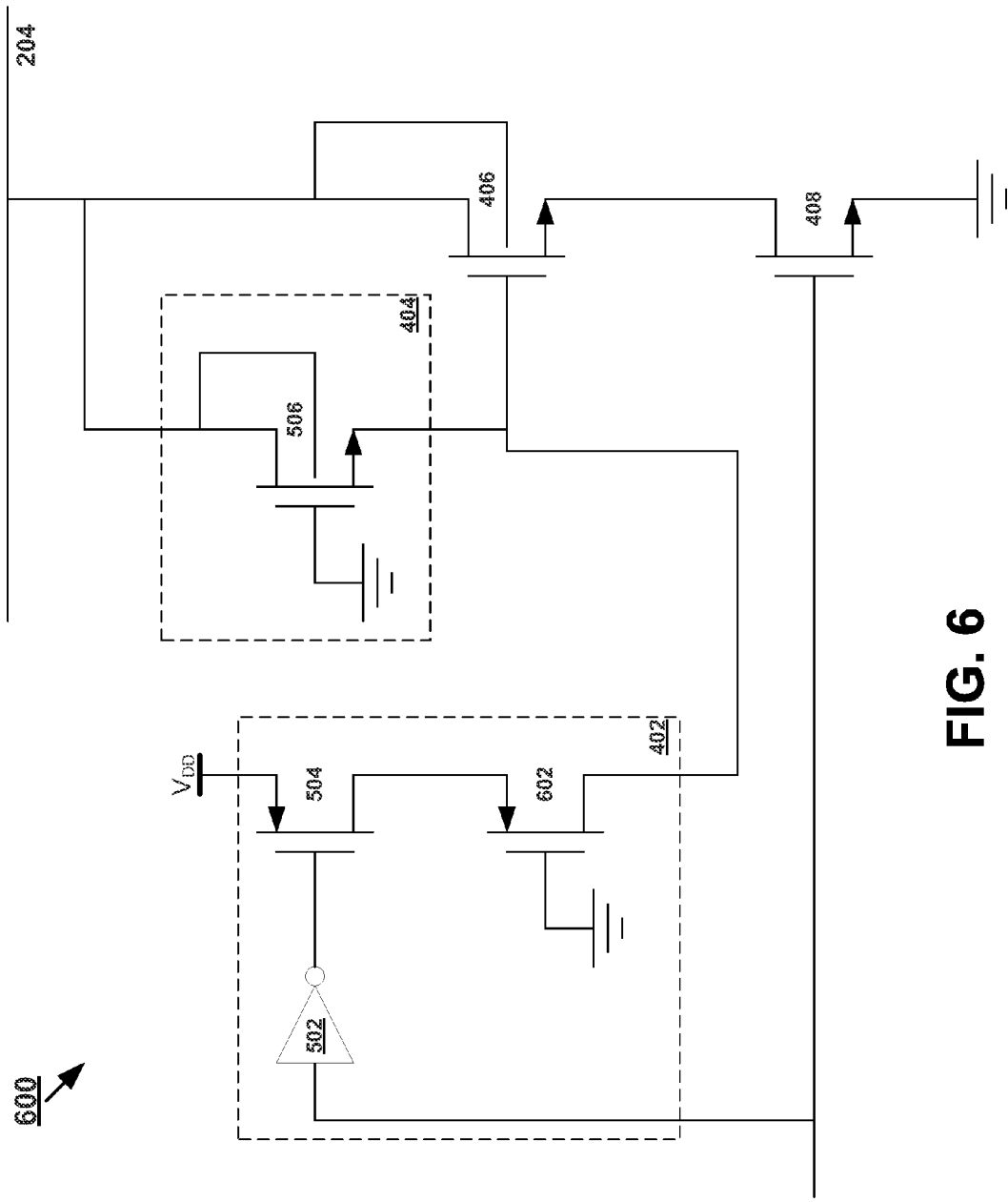
FIG. 6 shows another embodiment of a grounding switch.

FIG. 6 shows another embodiment of a grounding switch. In this embodiment, the voltage of the signal line swings between $V_{DD}$ and $-V_{DD}$. Thus, the total voltage between the source and drain of PFET 502 could be $2V_{DD}$ which can be outside the specifications of the transistor technology. This can potentially cause PFET 502 to operate out of specification, which can damage PFET 502. To address this problem PFET 602 is added to pull up circuit 402, by adding PFET 602 to grounding switch 600, the worst case voltage between the source and drain of each transistor is $V_{DD}$.

Figure 7:
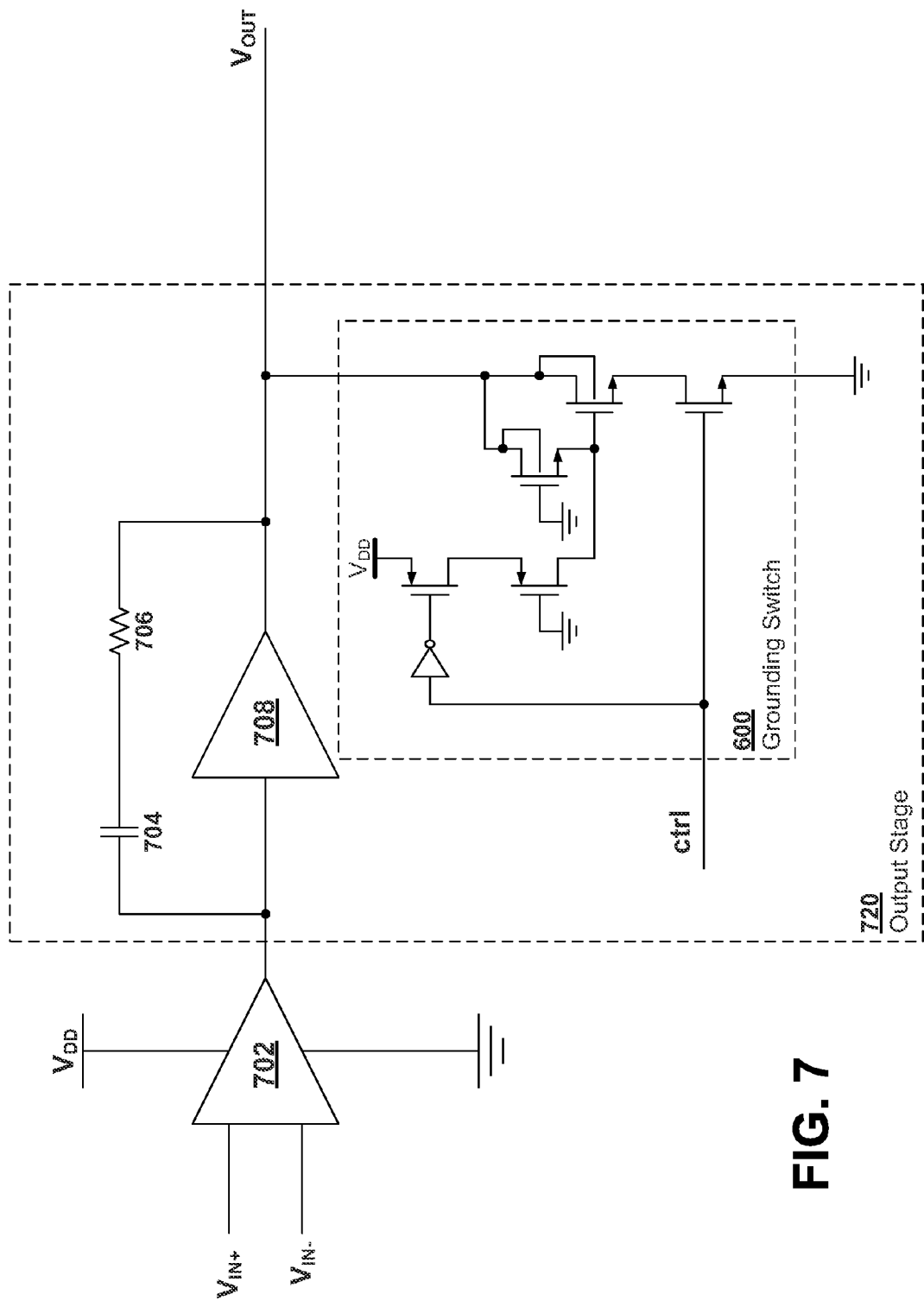
FIG. 7 an embodiment of audio driver employing a grounding switch to suppress audible pop during the power up and power down of the audio driver.

FIG. 7 an embodiment of audio driver employing a grounding switch to suppress audible pop during the power up and power down of the audio driver. The audio driver is shown comprising a two stage audio amplifier. For a digital audio driver, it can further comprise a digital to analog converter (not shown) as well as other audio processing components. In the example shown, the two stage audio amplifier comprises amplifier stage 702, and output stage 720. Output stage 720 comprises output driver 708, capacitor 704, resistor 706 and grounding switch 600. Capacitor 704 and resistor 706 are used to provide stability to the two stage amplifier. Grounding switch 600 is used to ground the output of output driver 708 during power up and power down so that an audible pop is not heard by the listener. Control signal ctrl is set high during power up and power down so grounding switch 600 is closed. Once the amplifier stage powers up and has settled into an operational mode. The grounding switch is opened by setting ctrl low and the audio signal is allowed to pass externally where a listener can hear it. It should be noted that while grounding switch 600 is used as an example, other embodiments, including any of the grounding switches described above, can also be used. Furthermore, since voltages are relative, the grounding switches described herein can also be used to tie differential inputs or outputs together.

Audio drivers such as that described are integral to a wide variety of electronic devices including but not limited to personal computer sound cards, voice-over-IP telephones, cellular telephones, digital picture frames, universal serial bus headsets, televisions, video game consoles, MP3 players and Bluetooth headsets.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. A switch connecting a first signal line and a second signal line comprising:
   a first isolated n-channel field effect transistor (NFET) with an isolated substrate connection, having a gate and a drain, wherein the drain is coupled to the first signal line;
   a second NFET having a gate coupled to a control signal and a source coupled to the second signal line, wherein the second NFET is in series with the first isolated NFET;
   a controlled pull-up circuit operable to receive the control signal, the controlled pull-up circuit coupled to the gate of the first isolated NFET; and
   a pull-down circuit coupled to the gate of the first isolated NFET;
   wherein the pull-up circuit pulls up the gate of the first isolated NFET to a positive supply voltage when the control signal is in a high state; and
   wherein the pull-down circuit pulls the gate of the first isolated NFET down to a negative supply voltage or the voltage of the first signal line when the control signal is in a low state.

2. The switch of claim 1 wherein the isolated substrate connection of the first isolated NFET is connected to a negative supply voltage and the pull-down circuit is coupled to the negative supply voltage.

3. The switch of claim 2, wherein the pull down circuit comprises a resistor.

4. The switch of claim 1 wherein the isolated substrate connection of the first isolated NFET is connected to the drain of the first isolated NFET and the pull-down circuit is coupled to the drain of the first isolated NFET.

5. The switch of claim 4, wherein the pull down circuit comprises a third isolated NFET having a drain and an isolated substrate connection, wherein the isolated substrate connection of the third isolated NFET is connected to the drain of the third isolated NFET.

6. The switch of claim 1, wherein the pull-up circuit comprises a p-channel field effect transistor (PFET) including a gate and an inverter coupled to the gate of the PFET.

7. The switch of claim 6, wherein the pull-up circuit further comprises a second PFET.

8. In an electronic device, an audio driver comprising:
   an amplifier stage;
   an output stage comprising an output driver, a resistor and a capacitor; and
   a grounding switch;
   wherein the amplifier stage is coupled to the output stage and the grounding switch is coupled to an output of the output stage; and
   wherein the grounding switch comprises:
      a first isolated NFET with an isolated substrate connection, having a gate and a drain;
      a second NFET having a gate coupled to a control signal, wherein the second NFET is in series with the first isolated NFET;
      a controlled pull-up circuit operable to receive a control signal, coupled to the gate of the first isolated NFET; and
      a pull-down circuit coupled to the gate of the first isolated NFET;
   wherein the pull-up circuit pulls up the gate of the first isolated NFET to a positive supply voltage when the control signal is in a high state; and
   wherein the pull-down circuit pulls the gate of the first isolated NFET down to a negative supply voltage or the voltage of the first signal line when the control signal is in a low state.

9. The audio driver of claim 8 wherein the isolated substrate connection of the first isolated NFET is connected to a negative supply voltage and the pull-down circuit is coupled to the negative supply voltage.

10. The audio driver of claim 9, wherein the pull down circuit comprises a resistor.

11. The audio driver of claim 8 wherein the isolated substrate connection of the first isolated NFET is connected to the drain of the first isolated NFET and the pull-down circuit is coupled to the drain of the first isolated NFET.

12. The audio driver of claim 11, wherein the pull down circuit comprises a third isolated NFET having a drain and an isolated substrate connection, wherein the isolated substrate connection of the third isolated NFET is connected to the drain of the third isolated NFET.

13. The audio driver of claim 8, wherein the pull-up circuit comprises a PFET coupled to an inverter.

14. The audio driver of claim 13, wherein the pull-up circuit further comprises a second PFET.

15. The audio driver of claim 8 wherein the electronic device is one of a personal computer sound card, a voice-over-IP telephone, a cellular telephone, a digital picture frame, a universal serial bus headset, a television, a video game console, an MP3 player or a Bluetooth headset.

* * * * *